United States Patent [19]

Tustaniwskyj et al.

[11] Patent Number: 4,677,370
[45] Date of Patent: Jun. 30, 1987

[54] METHOD OF TESTING WIRE BONDS FOR DEFECTS USING A MAGNETIC FIELD

[75] Inventors: Jerry I. Tustaniwskyj, Mission Viejo; Philip D. Corey, San Diego, both of Calif.

[73] Assignee: Unisys Corporation, Detroit, Mich.

[21] Appl. No.: 793,194

[22] Filed: Oct. 31, 1985

[51] Int. Cl.[4] ................ G01R 31/26; G01R 31/04
[52] U.S. Cl. ................................ 324/51; 29/574; 73/827; 324/158 R
[58] Field of Search ............... 324/158 R, 263, 51, 324/52; 29/574, 593; 73/150 A, 827; 228/103, 104

[56] References Cited

U.S. PATENT DOCUMENTS 3,572,108  3/1971  McShane et al. ............... 73/827
3,825,819  7/1974  Hansen et al. ................ 73/150 A

FOREIGN PATENT DOCUMENTS 59-178371  10/1984  Japan ...................... 324/158 R

OTHER PUBLICATIONS

Krongelb, S., "Electromagnetic Tensile Adhesion Test Method", Conference: Adhesion Measurement of Thin Films, Thick Films and Bulk Coatings, Philadelphia, Pa., Nov. 1976, pp. 107–121.

Primary Examiner—Reinhard J. Eisenzopf
Assistant Examiner—Stephen M. Baker
Attorney, Agent, or Firm—Charles J. Fassbender; L. Joseph Marhoefer

[57] ABSTRACT

In an integrated circuit package of the type in which multiple conductors are bonded between an integrated circuit chip and the body of the package, wire bonds are tested for defects by a method which includes the steps of: placing the integrated circuit package in a magnetic field; generating respective currents through the conductors while the package is in the field to thereupon induce a magnetic force; and monitoring the current through the conductors to determine if a bond breaks under the force and causes the current through it to stop.

12 Claims, 8 Drawing Figures

FIG.2.

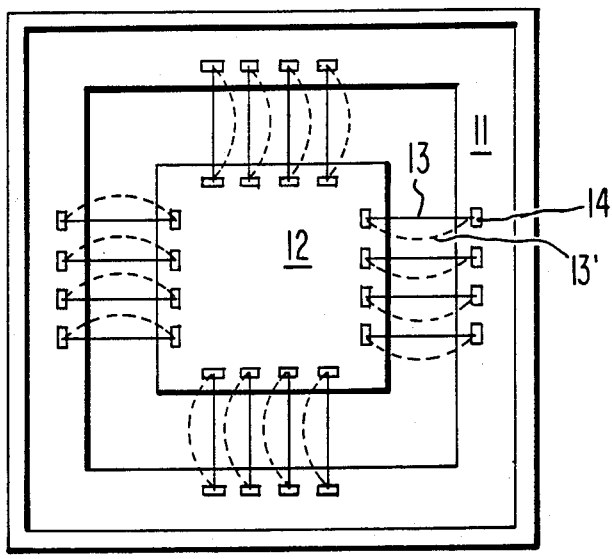

FIG.3.

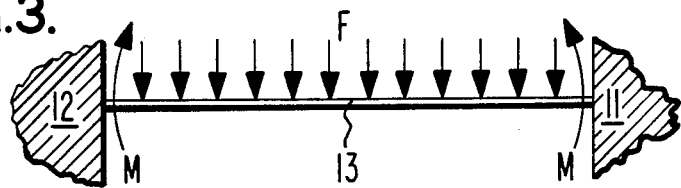

$$\text{eq1} \sim S \cong \frac{Mr}{I}$$

$$\text{eq2} \sim M = \frac{F\ell^2}{12}, \quad I = \frac{\pi r^4}{4}$$

$$\text{eq3} \sim S = \frac{\left[\frac{F\ell^2}{12}\right]r}{\frac{\pi r^4}{4}} = \frac{F\ell^2}{3\pi r^3}$$

$$\text{eq4} \sim S = \frac{Bi\ell^2}{3\pi r^3}$$

$$\text{eq5} \sim S_f = 5000\,\text{psi} @ 500 \times 10^6 \,\text{cy}$$

$$\text{eq6} \sim \text{TEST} = 1000\,\text{psi} @ 10^6 \,\text{cy}$$

$$\text{eq7} \sim Bi = 0.04$$

$$\text{eq8} \sim B = 1.0 \frac{\text{WEBER}}{\text{METER}^2}, \quad i = 40\,\text{ma}$$

$$eq21 \sim S' \propto \cfrac{S}{\sqrt{\left[1-\left(\cfrac{\omega}{\omega n}\right)^2\right]^2 + \left(2\delta\cfrac{\omega}{\omega n}\right)^2}}$$

$$eq22 \sim S' \propto \cfrac{1}{2\delta}$$

METHOD OF TESTING WIRE BONDS FOR DEFECTS USING A MAGNETIC FIELD

BACKGROUND OF THE INVENTION

This invention relates to integrated circuit packages of the type in which multiple wires are bonded to an integrated circuit chip; and more particularly, it relates to methods of testing the wire bonds for defects in such packages.

Typically, the above type of integrated circuit package includes a ceramic body having a cavity to which the back surface of the integrated circuit chip is attached. Various circuitry such as bipolar or CMOS or NMOS logic circuitry is integrated into the front surface of the chip. In order to transmit electrical signals to and from the circuitry on the chip, a plurality of discrete wires are bonded between bonding pads of metal signal lines in the body of the package and the front surface of the chip.

One way in which these bonds are formed is by a thermocompression method. In this method, a bonding tool presses the wire against the bonding pad at an elevated temperature which is below the melting temperature of the wire. This causes the wire to laterally spread in the bonding area and there make intimate contact with the bonding pad which results in the bond.

Wire bonds are also formed by an ultrasonic bonding method. In this method, a bonding tool presses the wire against the bonding pad and simultaneously vibrates the wire at ultrasonic frequencies. These vibrations disrupt and disperse any oxides and other films between the wire and bonding pad and thereby bring the wire and bonding pad into intimate contact which forms the bond.

To determine the quality with which these bonds are fabricated, the bonds between every wire and pad on the chip, and between every wire and pad on the body of the package, must be tested. To that end, mil standard 833c specifies a nondestructive bond pull test, the purpose of which is to reveal nonacceptable wire bonds. In this test, an apparatus having a hookshaped member is utilized to hook onto and pull each bonded wire with a predetermined force which the wire should be able to withstand. For example, bonded aluminum wire having a diameter of 0.00125 inches should withstand a pull force of 2.5 grams.

Such a test procedure works well for SSI and MSI chips of the prior art. However, modern VLSI chips have a very large number of bonding wires, (e.g., over one hundred wires). Consequently, pulling on each of the bonding wires one at a time with a hook is very time-consuming. Further, as the number of bonding wires increases, the space between the bonding wires is forced to decrease. Bonding wires on modern VLSI chips can be spaced by only 0.006 inches. As a result, placing the hook of the testing apparatus around a single bonding wire without damaging or shorting some of the adjacent wires is very difficult and tedious.

Accordingly, a primary object of the invention is to provide an improved method for testing the wire bonds of an integrated circuit package which overcomes the above described problems.

BRIEF SUMMARY OF THE INVENTION

According to the present invention, the above object and others are achieved by a method which includes the steps of: placing an integrated circuit package in a magnetic field; generating a current through the bonding wires of the package while the package is in the field to thereupon induce a magnetic force; and, monitoring the current through the bonding wires to determine if a bond to any wire breaks under the magnetic force thereby causing the current to stop.

BRIEF DESCRIPTION OF THE FIGURES

Various features and advantages of the invention are described herein in conjunction with the accompanying drawings wherein:

FIG. 2 is a top view of the integrated circuit package of FIG. 1 illustrating how the bonding wires deflect when their bonds are being tested;

FIG. 3 shows a mathematical analysis of how the stress, B field, and current interact during the wire bond test of FIGS. 1 and 2;

DETAILED DESCRIPTION OF THE INVENTION

Figure 1:
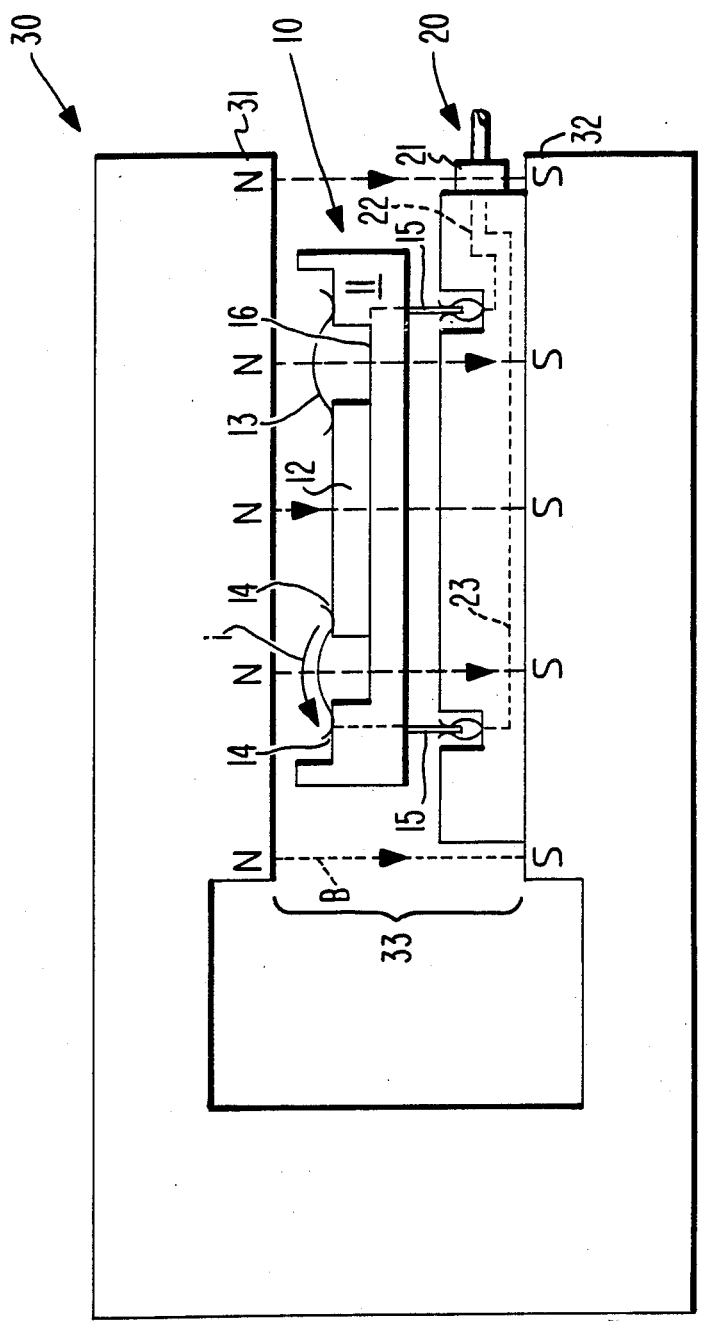
FIG. 1 illustrates the claimed method by which wire bonds are tested.

Referring now to FIG. 1, the details of the claimed method of testing wire bonds for defects in an integrated circuit package will be described. In FIG. 1, reference numeral 10 indicates the integrated circuit package whose wire bonds are being tested. This package includes a ceramic body 11, an integrated circuit chip 12, and a plurality of discrete wires 13 which are bonded at their ends between bonding pads of metal signal lines in the body 11 and chip 12. Those bonds 14 are what the claimed invention tests.

To perform the test, electrical signals are applied to the package 10 in a fashion which causes a current "i" to flow through the wires 13. This is achieved by placing the input/output terminals 15 of package 10 into a socket 20 and by applying appropriate voltages to a connector 21 of the socket.

While the current i is flowing through the conductors, a magnetic field B is directed through the package. In FIG. 1, this magnetic field B is produced by a permanent magnet 30 having a north pole 31, a south pole 32, and an air gap 33 in which the package 10 and socket 20 are placed. Preferably, magnet 30 has a retentivity of at least 1.0 Weber's per meter squared such as that of Tungsten steel or Alnico V and VI.

In operation, the magnetic field B and current i interact to produce a force on the conductors 13 which is perpendicular to the plane of FIG. 1. As a result, the wires 13 are deflected sideways as illustrated by the dashed lines 13' in FIG. 2. Preferably, the magnitude of the current i is generated to change in a cyclic fashion to cause the wire to move back and forth.

By moving the wire 13 back and forth for several cycles, the magnitude of the magnetic force which is required to test the bond 14 is substantially reduced over that which is required by a nondestructive pull test. This is because the force which a wire bond can withstand decreases with an increase in the number of times which that force is applied to the bond.

To move wire 13 back and forth, it is not necessary that the current i be made to flow in both directions through the wire. All that is needed is that the magnitude of the current i be made to vary in a cyclic fashion from a value at or near zero to a predetermined maximum. Then, as the current i decreases from its maximum value, the mechanical stresses in the wire will move it back to its rest position.

Turning now to FIG. 3, suitable values for the magnetic field B and current i in the above wire bond test will be mathematically estimated. In this mathematical analysis, the wire 13 is treated as a beam which is fixed (bonded) at its ends between chip 12 and package 11. A static force is uniformly applied to the beam, and F is the force per unit length. This is shown in the force diagram of FIG. 3; and equation 1 of FIG. 3 gives the stress which is present at the ends of the wire in that diagram.

In equation 1, S is the stress at the ends of the wire; M is the bending moment at the ends of the wire which is caused by the distributed load F; r is the radius of the wire, and I is the moment of inertia of the wire. Equation 2 restates quantities M and I in terms of the radius of the wire r, the length of the wire l, and the force per unit length F on the wire.

Substituting equation 2 into equation 1 yields equation 3 which expresses the stress in the ends of wire 13 in terms of the parameters F, l, and r. This equation can be further modified by using the relation: magnetic force on a wire equals the length of the wire times the cross product of the wire's current i and the wire's surrounding B field. Thus, equation 3 can be rewritten as equation 4.

For annealed aluminum bonding wire, the fatigue strength S is 5,000 PSI at 500 million cycles. This means that the wire can be flexed back and forth 500 million times from a stress of $-5,000$ to 5,000 PSI before breaking. This is stated as equation 5. Thus, a suitable nondestructive fatigue test for the wire would be to cycle the stress in the wire from 0 PSI to 1,000 PSI about a million times. This is stated as equation 6.

Typical values for the length l and radius r of a bonding wire respectively are 0.100 inches and 0.00125 inches. Converting these values for stress S, length l, and radius r into RMKS units and the result into equation 4 yields equation 7. Suitable values for B and i can then be picked which meet the constraint of equation 7. For example, as stated in equation 8, the maximum value of the current i can be set equal to 40 milliamps, and the magnetic field B can be set equal to 1.0 Weber's per square meter.

Consider now in further detail the steps by which the current i is generated in the bonding wires 13 in the case where chip 12 is a bipolar logic circuit. This case is depicted in FIG. 4A in which some of the bonding wires 14a carry input logic signals while other bonding wires 13b carry output logic signals. Also in FIG. 4A, reference numeral 40 indicates the bipolar logic on the chip; and reference numerals 41, 42, and 43 respectively indicate an inverter and two bipolar transistors which are intercoupled in a push-pull fashion to drive the output conductor 13b.

One way to generate the current i in the conductors 13a of the FIG. 4A circuit is to apply high logic signals to all of those input conductors. Thereafter, current can be generated in the output conductor 13b by applying a set of logic signals to the input conductors 13a such that the push-pull transistor 42 turns on.

However, as an alternative, the current i can also be generated in the output conductor 13b independent of the signals which are applied to the input conductors 13a. How this is achieved is illustrated in FIG. 4B. In that figure, the physical makeup of the bipolar transistors 42 and 43 are shown in cross section; and C(N) indicates an N type collector region, B(P) indicates a P type base region, and E(N) indicates an N type emitter region.

Under normal operating conditions, the supply voltages $V_{CC}$ and $V_{EE}$ are such that the collector-substrate junctions are reverse biased. Typically, $V_{CC}$ is 5 volts and $V_{EE}$ is 0 volts. Under these conditions, no current flows through the collector-substrate junctions.

However, by choosing the supply voltages differently, the collector-substrate junctions of transistors 42 and 43 can be forward biased; and this in turn will cause current to flow through the output conductor 13b independent of the input signals. For example, the substrate voltage $V_{EE}$ can be biased at +5 volts and the collector supply voltage $V_{CC}$ biased at 0 volts.

FIG. 1 illustrates the current loop for one of the output conductors 13b as an example. This loop consists of a conductor 22 in socket 20, the right-hand terminal 15 of package 10 which connects via a conductor 16 to the back surface of chip 12, chip 12 itself, the left bond wire 13, the left-hand terminal 15 of package 10, and a conductor 23 of socket 20. Generating the current i through the back of the chip is very attractive when a large number of chips having different logic sections 40 are to be tested, or when a single chip which generates many different output signals is to be tested because the input signals don't have to be tailored to the particular chip.

Figure 4C:
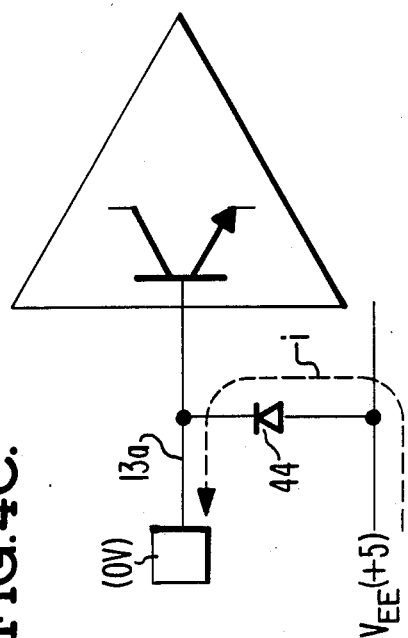
FIGS. 4A-4C illustrate the steps by which current can be generated in the bonding wires of a chip which contains bipolar logic circuitry.
Figure 4A:
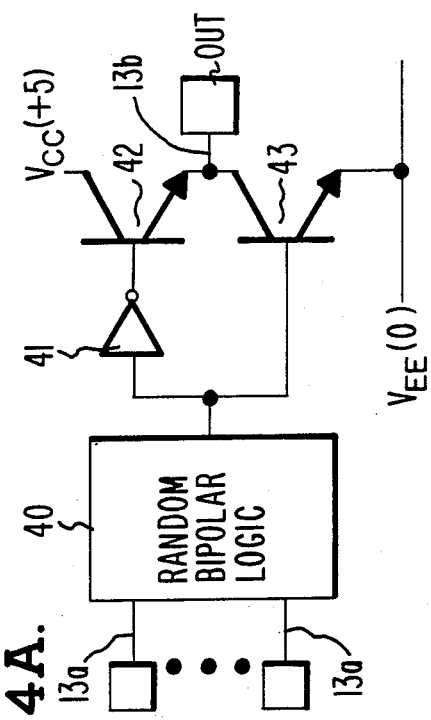
Figure 4B:
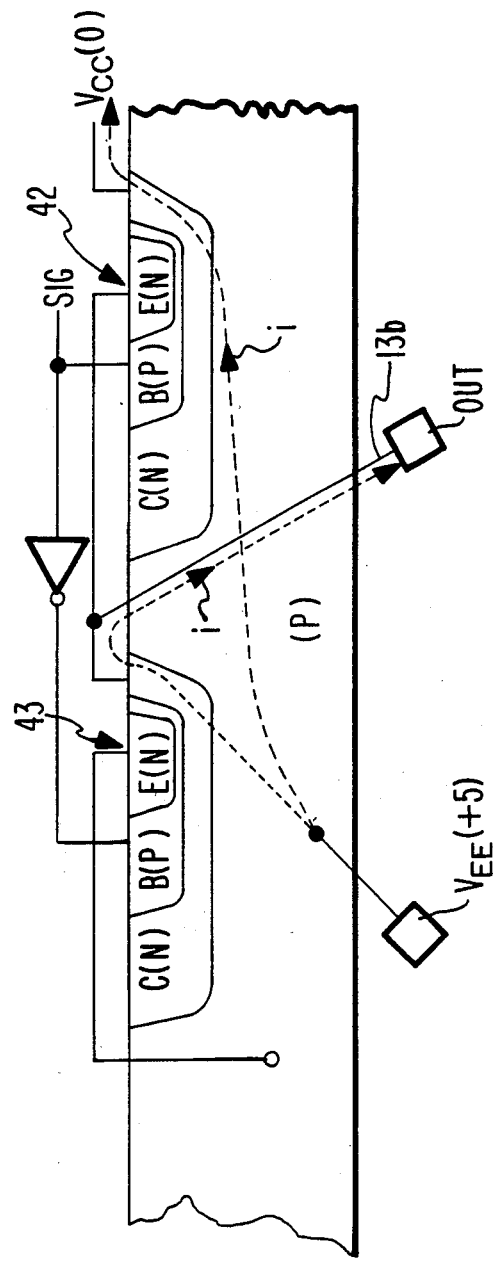

Usually the input of a bipolar logic circuit is coupled through a protection diode 44 to the substrate as illustrated in FIG. 4C. For those circuits, when the substrate is biased at a higher voltage than the voltage on the input conductor 13a, current flows through the back surface of the chip, then through the input protection diode 44 and then through the input conductor 13a. An attractive feature of this is that the magnitude of the current which can flow through the protection diode 44 is usually bigger than the normal input current to a logic circuit, so consequently the Bi constraint of equation 7 is more easily met.

In the case where chip 12 contain CMOS or NMOS field effect type logic, a similar method may be used to generate the current i in the conductors 13. Such a circuit would be depicted in the same fashion as FIG. 4A but with block 40 reading "field effect logic" and transistors 42 and 43 being field effect transistors. A cross-sectional view of such output field effect transistors 42' and 43' is shown in FIG. 5.

Figures 5, 6:
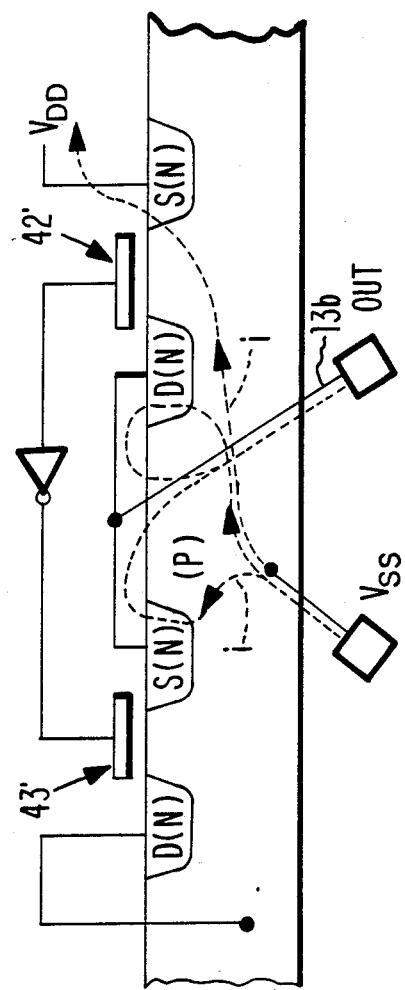
FIG. 5 illustrates the steps by which current can be generated in the bonding wires of a chip which contains field effect logic circuitry.
FIG. 6 shows equations which describe how stress on the bonding wires vary as a function of the frequency of the current through the wires.

Under normal operating conditions, the FIG. 5 circuit is biased such that supply voltage $V_{DD}$ is +5 volts and substrate bias voltage $V_{SS}$ is 0 volts. However, by changing the substrate bias voltage $V_{SS}$ to +5 volts and the supply voltage $V_{DD}$ to 0 volts, current will flow through output conductor 13b independent of the signals on the input conductors 13a. At the same time, current will also flow through the input conductors since the input to field effect gates is almost always connected to input protection diodes just like those of FIG. 4C.

A preferred method for testing wire bonds in an integrated circuit package in accordance with the invention has now been described in detail. In addition, however, many changes and modifications can be made to these details without departing from the nature and spirit of the invention.

For example, the permanent magnet 30 of FIG. 1 can be replaced with an electromagnet. One such electromagnet could have a solid core with the same shape as magnet 30 on which an electric coil is wound. Suitable materials for the electromagnet core are ordinary transformer steel which has a saturation B field of at least 1.8 Weber's per met$^2$, and Permendur (49.7% Fe, 50% Co, 0.3% Mn) which has a saturation field of 2.45 Weber's per met$^2$. This modification enables the Bi constraint of equation 7 to be met with a larger B field and smaller current i. As one example, setting B=2.45 Weber's per met$^2$ yields a current of only 16.3 ma.

As another modification, even smaller values of current i can be utilized to obtain a given stress by sinusoidally varying the magnitude of the current at or near (i.e.,—within 100 Hz of) the natural frequency of the bonding wire. Equation 21 of FIG. 6 states how the peak stress S' in the ends of a bonding wire varies with the frequency $\omega$ when a sinusoidal current passes through the wire.

In this equation, S is the stress as previously given by equation 1 of FIG. 3, $\omega$ is the frequency of the current, $\omega_n$ is the natural frequency of the bonding wire with both of its ends held fixed (bonded), and $\delta$ is the structural damping factor of the wire. When the frequency of the current equals the natural frequency of the bonding wire (i.e.—when $\omega = \omega_n$), equation 21 reduces to equation 22.

Physically, the structural damping factor $\delta$ represents a force f which opposes the movement of the wire with a magnitude that is proportional to the velocity v at which the wire is moving. That is, f is proportional to $\delta v$. Generally $\delta$ is less than 0.05. For annealed aluminum $\delta$ typically is about 0.003, and so S' is about 166 times S. This enables the wire to be tested in B fields of 1 Weber/met$^2$ with currents of 5 to 0.5 milliamps.

As yet another modification, the wires 13 whose bonds are being tested can be of the type which are contained on a TAB tape. In such a tape, all of the conductors for the integrated circuit package are held in the pattern at which they are to be bonded by a thin nonconducting film, and their ends are all bonded to the chip at the same time.

Accordingly, since many such changes and modifications to the above details can be made, it is to be understood that the invention is not limited to those details but is defined by the appended claims.

What is claimed is:

1. A method of testing bonds in an integrated circuit package by fatigue; said package being of a type that contains an integrated circuit chip having a flat surface in which a plurality of circuits are disposed; said package further including conductors, for carrying signals to and from said circuits, which are bonded to said chip surface and which extend radially from said surface to a body portion of said package where they are again bonded; wherein said method includes the steps of:
    placing said integrated circuit package in a magnetic field such that said field is substantially perpendicular to said surface of said chip;
    wiggling said conductors back and forth between said bonds in directions parallel to said surface of said chip by generating respective currents through said conductors with cyclicly varying magnitudes while said chip surfaces lies substantially perpendicular to said field; and
    monitoring said currents through said conductors to determine if any bond breaks by fatigue due to said wiggling step.

2. A method according to claim 1 and further including the step of limiting the maximum magnitudes of said magnetic field and said currents such that the maximum magnetic force which wiggles said conductors is substantially less than a pre-established force which each bond must be able to withstand for one pull.

3. A method according to claim 2 wherein said conductors which are bonded to said chip surface and said body portion of said package have a natural frequency; and wherein said method includes the step of cyclicly varying the magnitudes of said currents in said conductors near said natural frequency.

4. A method according to claim 3 wherein said circuits include: a plurality of logic gates which are interconnected on said chip to generate multiple output signals, bipolar transistors with bases which receive said output signals, and collectors which are bonded to said conductors; and wherein said method further includes the step of generating said currents through said conductors by applying a voltage to the substrate of said chip which forces said currents to flow serially through said substrate, said collectors, and said conductors independent of the state of said output signals.

5. A method according to claim 3 wherein said circuits include: a plurality of logic gates which are interconnected on said chip to generate multiple output signals, field effect transistors with gates which receive said output signals, and drains which are bonded to said conductors; and wherein said method further includes the step of generating said currents through said conductors by applying a voltage to the substrate of said chip which forces said currents to flow serially through said substrate, said drains, and said conductors independent of the state of said output signals.

6. A method according to claim 3 wherein said conductors are discrete wires.

7. A method according to claim 3 wherein said conductors are contained in a TAB tape.

8. A method of testing bonds in an integrated circuit package by fatigue; said package being of a type that contains an integrated circuit chip having a major surface in which a plurality of circuits are disposed; said package further including conductors, for carrying signals to and from said circuits, which are bonded to said chip surface and which extend beyond the perimeter of said surface to a body portion of said package where they are again bonded; wherein said method includes the steps of:
    generating respective currents through said conductors while said integrated circuit package in a magnetic field that is substantially perpendicular to said surface of said chip; and
    wiggling said conductors back and forth by cyclicly varying the product of said field times said currents while said chip surface is substantially perpendicular to said field, to thereby break defective bonds by fatigue.

9. A method according to claim 8 and further including the step of limiting the maximum magnitudes of said magnetic field and said currents such that the maximum magnetic force which wiggles said conductors is substantially less than a pre-established force which each bond must be able to withstand for one pull.

10. A method according to claim 8 wherein said conductors which are bonded to said chip surface and said body portion of said package have a natural frequency; and wherein said method includes the step of cyclicly varying the magnitudes of said currents in said conductors near said natural frequency.

11. A method according to claim 8 wherein said circuits include: a plurality of logic gates which are interconnected on said chip to generate multiple output signals, bipolar transistors with bases which receive said output signals, and collectors which are bonded to said conductors; and wherein said method further includes the step of generating said currents through said conductors by applying a voltage to the substrate of said chip which forces said currents to flow serially through said substrate, said collectors, and said conductors independent of the salts of said output signals.

12. A method according to claim 8 wherein said circuits include: a plurality of logic gates which are interconnected on said chip to generate multiple output signals, field effect transistors with gates which receive said output signals, and drains which are bonded to said conductors; and wherein said method further includes the step of generating said currents through said conductors by .applying a voltage to the substrate of said chip which forces said currents to flow serially through said substrate, said drains, and said conductors independent of the state of said output signals.

* * * * *